US012770661B2

(12) United States Patent
Lai

(10) Patent No.: US 12,770,661 B2
(45) Date of Patent: Oct. 20, 2026

(54) METHOD FOR RETRIEVING PRESET TRIM CODE AND TRIM CODE RELOADING SYSTEM

(71) Applicant: eMemory Technology Inc., Hsinchu (TW)

(72) Inventor: Tzu-Neng Lai, Hsinchu County (TW)

(73) Assignee: eMemory Technology Inc., Hsinchu (TW)

( * ) Notice: Subject to any disclaimer, the term of this patent is extended or adjusted under 35 U.S.C. 154(b) by 168 days.

(21) Appl. No.: 18/970,948

(22) Filed: Dec. 6, 2024

(65) Prior Publication Data

US 2025/0191625 A1 Jun. 12, 2025

Related U.S. Application Data

(60) Provisional application No. 63/608,842, filed on Dec. 12, 2023.

(51) Int. Cl.
*G11C 7/10* (2006.01)
*G11C 17/18* (2006.01)

(52) U.S. Cl.
CPC ............ *G11C 7/1069* (2013.01); *G11C 7/109* (2013.01); *G11C 17/18* (2013.01)

(58) Field of Classification Search
CPC ....... G11C 7/1069; G11C 7/109; G11C 17/18; G11C 29/021; G11C 29/028; G11C 5/147; G11C 11/4099; G11C 11/409
See application file for complete search history.

(56) References Cited

U.S. PATENT DOCUMENTS 7,532,056 B2 5/2009 Seo et al.
2004/0245977 A1* 12/2004 Tran .......................... G05F 3/30 323/315
2006/0043957 A1 3/2006 Carvalho
2009/0296464 A1 12/2009 Gasquet et al.
2019/0171241 A1* 6/2019 Elsayed .................... G05F 3/30
2020/0176070 A1* 6/2020 Jimenez-Olivares ........................ G11C 29/028
2024/0274212 A1* 8/2024 Kim ..................... G11C 29/021

FOREIGN PATENT DOCUMENTS

TW 202303619 A 1/2023

* cited by examiner

*Primary Examiner* — Jerome Leboeuf
(74) *Attorney, Agent, or Firm* — CKC & Partners Co., LLC

(57) ABSTRACT

The present disclosure provides a method and a trim code reloading system. The method is for retrieving a preset trim code, wherein the preset trim code is for trimming a bandgap reference circuit and is stored in a memory block. The method includes: setting a first input trim code for the bandgap reference circuit, wherein a read bias voltage is generated according to the first input trim code; reading the memory block biased by the read bias voltage, to obtain an output trim code; determining if the output trim code is the same as the first input trim code; and using the first input trim code or the output trim code as a retrieved preset trim code when the output trim code is the same as the first input trim code.

17 Claims, 6 Drawing Sheets

100

400

METHOD FOR RETRIEVING PRESET TRIM CODE AND TRIM CODE RELOADING SYSTEM

CROSS-REFERENCE TO RELATED APPLICATION

This application claims priority to U.S. Provisional Application Ser. No. 63/608,842, filed on Dec. 12, 2023, which is herein incorporated by reference.

BACKGROUND

Field of Invention

This disclosure relates to a method and system, in particular to a method and system capable of retrieving a trim code for trimming a bandgap reference circuit.

Description of Related Art

In order to generate a reference voltage level, some related arts use an existing bandgap reference circuit including at least an operation amplifier and a BJT (Bipolar Junction transistor) pair. However, the reference voltage level provided by this existing bandgap reference circuit is not suitable for some applications requiring a low power voltage. Therefore, it is necessary to propose a new circuit architecture and/or approach for addressing those issues.

SUMMARY

An aspect of present disclosure relates to a method for retrieving a preset trim code. The preset trim code for trimming a bandgap reference circuit and is stored in a memory block. The method includes: setting a first input trim code for the bandgap reference circuit, wherein a read bias voltage is generated according to the first input trim code; reading the memory block biased by the read bias voltage, to obtain an output trim code; determining if the output trim code is the same as the first input trim code; and using the first input trim code or the output trim code as a retrieved preset trim code when the output trim code is the same as the first input trim code.

Another aspect of present disclosure relates to a method for retrieving a preset trim code. The preset trim code is for trimming a bandgap reference circuit and is stored in a plurality of memory blocks. The method includes: conducting operations (a)-(c) to each memory block: (a) setting a first input trim code for the bandgap reference circuit, wherein a read bias voltage is generated according to the first input trim code; (b) reading the memory block biased by the read bias voltage, to obtain an output trim code; and (c) determining if the output trim code is the same as the first input trim code; when a plurality of first input trim codes set for the plurality of memory blocks are respectively identical to a plurality of output trim codes obtained by reading the plurality of memory blocks, setting the plurality of first input trim codes or the plurality of output trim codes as a plurality of candidate preset trim codes; classifying the plurality of candidate preset trim codes into at least one group according to values of the plurality of candidate preset trim codes; and when a first group of the at least one group has a number of candidate preset trim codes greater than a majority threshold, using a candidate preset trim code in the first group as a retrieved preset trim code.

Another aspect of present disclosure relates to a trim code reloading system. The trim code reloading system is configured to retrieve a preset trim code, wherein the preset trim code is for trimming a bandgap reference circuit and is stored in a memory block. The trim code reloading system includes a control circuit and a read circuit. The control circuit is coupled to the bandgap reference circuit, and is configured to set a first input trim code for the bandgap reference circuit, wherein a read bias voltage is generated according to the first input trim code. The read circuit is coupled to the control circuit and the memory block, and is configured to read the memory block biased by the read bias voltage, to obtain an output trim code. The control circuit is configured to determine if the output trim code is the same as the first input trim code, and is configured to use the first input trim code or the output trim code as a retrieved preset trim code when the output trim code is the same as the first input trim code.

It is to be understood that both the foregoing general description and the following detailed description are by examples, and are intended to provide further explanation of the invention as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

The embodiments are described in detail below with reference to the appended drawings to better understand the aspects of the present application. However, the provided embodiments are not intended to limit the scope of the disclosure, and the description of the structural operation is not intended to limit the order in which they are performed. Any device that has been recombined by components and produces an equivalent function is within the scope covered by the disclosure.

As used herein, "coupled" and "connected" may be used to indicate that two or more elements physical or electrical contact with each other directly or indirectly, and may also be used to indicate that two or more elements cooperate or interact with each other.

Figure 1:
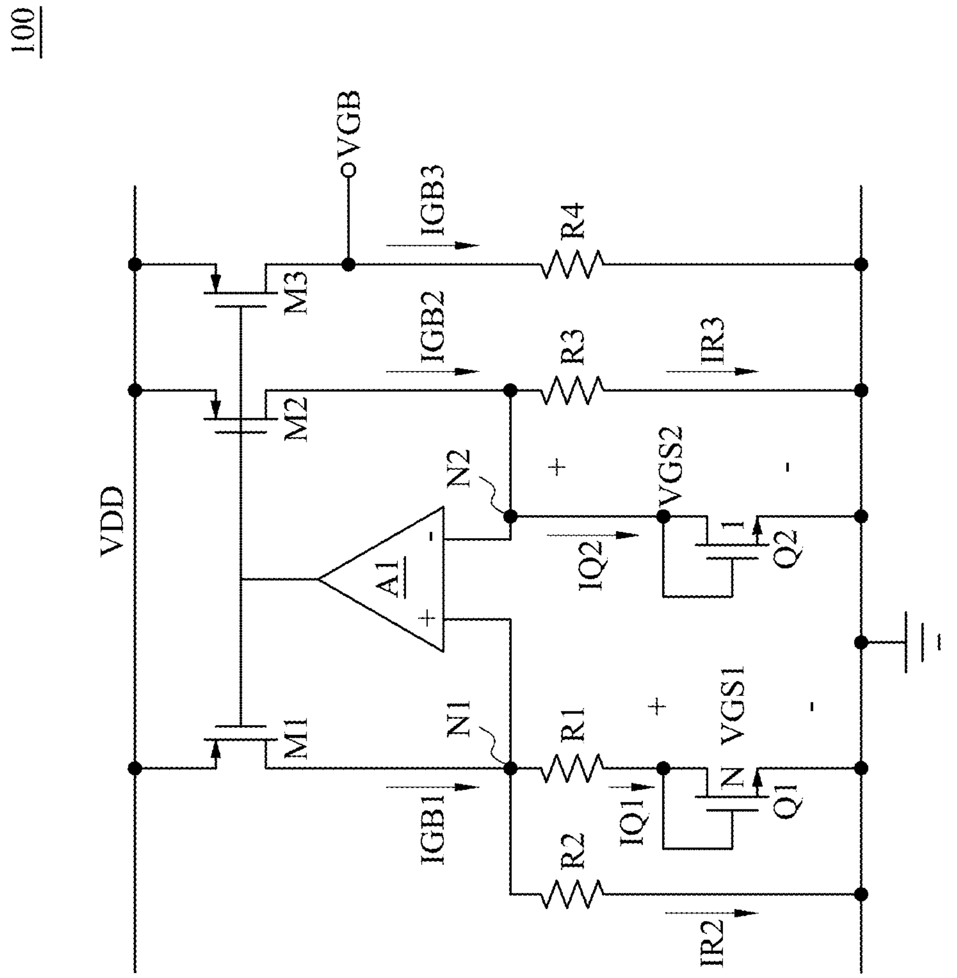
FIG. 1 is a schematic diagram of a bandgap reference circuit in accordance with some embodiments of the present disclosure.

Referring to FIG. 1, FIG. 1 is a schematic diagram of a bandgap reference circuit 100 in accordance with some embodiments of the present disclosure. In some embodiments, the bandgap reference circuit 100 is configured to generate a reference signal VGB. Notably, the voltage level of the reference signal VGB can be used as a reference point of every voltage signal in other circuits which are required to be operated in a low power voltage condition.

In some embodiments, as shown in FIG. 1, the bandgap reference circuit 100 includes an amplifier A1, a plurality of current mirror transistors M1-M3, a plurality of transistors Q1 and Q2 and a plurality of resistors R1-R4. In particular, an output terminal of the amplifier A1 is connected to gate terminals of the current mirror transistors M1-M3, and three source terminals of the current mirror transistors M1-M3 are coupled to a power voltage VDD. Two drain terminals of the current mirror transistors M1 and M2 are connected to a non-inverting input terminal (marked as "+" in FIG. 1) and an inverting input terminal (marked as "−" in FIG. 1) of the amplifier A1 through a node N1 and a node N2, respectively, and a drain terminal of the current mirror transistor M3 is connected to a first terminal of the resistor R4. The node N1 is further connected to a first terminal of the resistor R1 and a first terminal of the resistor R2. Both a gate terminal and a drain terminal of the transistor Q1 are connected to a second terminal of the resistor R1. The node N2 is further connected to a gate terminal and a drain terminal of the transistor Q2 and a first terminal of the resistor R3. In addition, two source terminals of the transistors Q1 and Q2 and three second terminals of the resistors R2-R4 are grounded. As should be noted, a size (i.e., the width-to-length ratio) of the transistor Q1 may be N times a size of the transistor Q2, the current mirror transistors M1-M3 may have the same size, and the resistors R2 and R3 may have the same resistance.

Based on the above-described configuration of the bandgap reference circuit 100, voltages at the nodes N1 and N2 should be at the same level, and a current IGB1 which flows from the current mirror transistor M1 to the node N1 should have the same magnitude as a current IGB2 which flows from the current mirror transistor M2 to the node N2. Accordingly, a current IR2 flowing through the resistor R2 has the same magnitude as a current IR3 flowing through the resistor R3, and a current IQ1 flowing through both the resistor R1 and the transistor Q1 has the same magnitude as a current IQ2 flowing through the transistor Q2. Furthermore, by the current mirror transistors M1-M3 which operate together as a current mirror circuitry, a current IGB3 is generated to flow from the current mirror transistor M3 and through the resistor R4. Thus, the reference signal VGB is generated between the drain terminal of the current mirror transistor M3 and the first terminal of the resistor R4.

Furthermore, in FIG. 1, a voltage VGS1 is a voltage drop across the gate terminal and the source terminal of the transistor Q1, and a voltage VGS2 is a voltage drop across the gate terminal and the source terminal of the transistor Q2. When the resistor R1 has a resistance "r1" and both the resistors R2 and R3 have a resistance "r2", the current IGB3 can be expressed in an equation (1): $IGB3=((VGS2-VGS1)/r1)+(VGS2/r2)$ . . . (1). Also, when the resistor R4 has a resistance "r3", the reference signal VGB can be expressed in an equation (2): $VGB=IGB3\times r3$ . . . (2).

In some embodiments of FIG. 1, the current mirror transistors M1-M3 are implemented with PMOS (P-type metal-oxide-semiconductor) transistors, and the transistors Q1 and Q2 are implemented with NMOS (N-type metal-oxide-semiconductor) transistors. Since the threshold voltages of the MOS transistor pair (i.e., the transistors Q1 and Q2) are low in advanced manufacturing processes, the reference signal VGB generated by the bandgap reference circuit 100 is low enough for the circuits required to be operated in the low power voltage condition. However, the threshold voltage variation of the MOS transistor pair also results in the voltage level of the reference signal VGB varying in a large range (e.g., the margin of the voltage level was plus or minus 10-15%), which does not benefit the circuits which use the reference signal VGB as the reference point. Thus, in some embodiments, the bandgap reference circuit 100 is trimmed, so as to improve the stability of the reference signal VGB.

In accordance with the above embodiments, because the magnitude of the current IGB3 is substantially fixed in the equation (2), the resistance "r3" of the resistor R4 is trimmed in some embodiments to compensate the threshold voltage variation of the MOS transistor pair. Notably, by trimming the resistance "r3" of the resistor R4, the voltage level of the reference signal VGB can be limited to varying in a small range (e.g., the margin of the voltage level was plus or minus 3%).

Figure 2A:
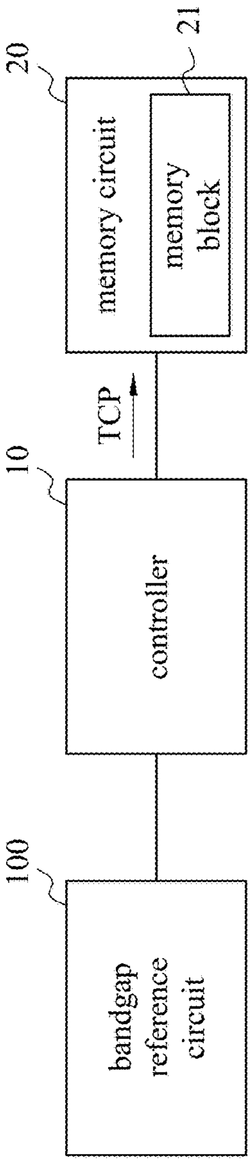
FIG. 2A is a schematic diagram of the bandgap reference circuit which is trimmed by a controller in accordance with some embodiments of the present disclosure.

Referring to FIG. 2A, FIG. 2A is a schematic diagram of the bandgap reference circuit 100 which is trimmed by a controller 10 in accordance with some embodiments of the present disclosure. In some further embodiments of FIG. 1, the resistor R4 is a variable resistor including a plurality of sub-resistors and a plurality of switches. In some embodiments, the sub-resistors are connected in series, and each switch is connected to two terminals of a respective sub-resistor. The controller 10 can selectively turn on or off the respective switches to bypass corresponding resistors to trim the resistance "r3" of the resistor R4, that is, any switch which is turned on can short-circuit the respective sub-resistor. Accordingly, the resistance "r3" of the resistor R4 is changed.

In some embodiments, after a trim of the bandgap reference circuit 100 is completed, the controller 10 gets one specific code corresponding to one specific resistance (hereinafter referred to as "the preset resistance") of the resistor R4, where the preset resistance compensates the threshold voltage variation of the MOS transistor pair. In FIG. 2A, this specific code is regarded as a binary preset trim code TCP, but the preset trim code TCP is not limited to be the binary form. The controller 10 can store the preset trim code TCP in a memory circuit 20. In some embodiments, the memory circuit 20 includes at least one memory block 21. The memory block 21 can be implemented with an one-time programmable (OTP) memory block, but the present disclosure is not limited herein.

Figure 2B:
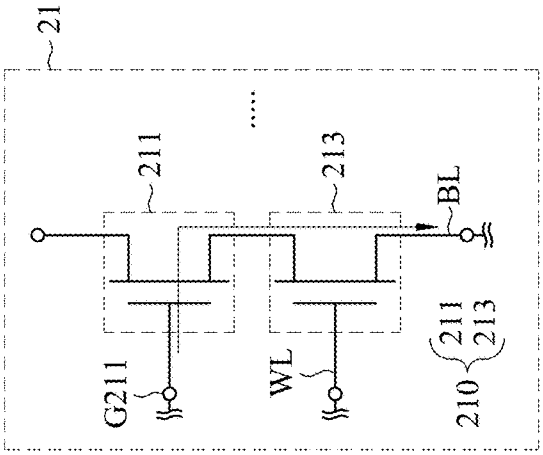
FIG. 2B is a schematic diagram of a memory block in accordance with some embodiments of the present disclosure.

Referring to FIG. 2B, FIG. 2B is a schematic diagram of the memory block 21 in accordance with some embodiments of the present disclosure. In some embodiments, the memory block 21 includes a plurality of memory cells 210. Each memory cell 210 includes a programmable transistor 211 and a select transistor 213. The programmable transistor 211 is an anti-fuse transistor, and both the programmable transistor 211 and the select transistor 213 are implemented with MOS transistors. A drain terminal of the programmable transistor 211 is floating, and a source terminal of the programmable transistor 211 is connected to a drain terminal of the select transistor 213. A source terminal of the select transistor 213 is connected to a bit line BL, and a gate terminal of the select transistor 213 is connected to a word line WL. When the programmable transistor 211 is programed, a gate oxide layer (not shown) which is corresponding to a gate terminal G211 of the programmable transistor

211 may be ruptured by applying a high voltage between the gate terminal G211 and the source terminal of the programmable transistor 211. Thus, during the reading operation, a current can flow from the gate terminal G211 to the source terminal of the programmable transistor 211 and through the select transistor 213 (along an arrow shown in FIG. 2B) if the gate oxide layer of the programmable transistor 211 is ruptured, which means data of logic "0" is written in the memory cell 210. In contrast, if the gate oxide layer of the programmable transistor 211 is not ruptured, data of logic "1" is written in the memory cell 210. Therefore, during the reading operation, there is no current or approximately zero current flowing out the memory cell 210. It should be understood that a number of the memory cells 210 in the memory block 21 is at least equal to a bit length of the preset trim code TCP.

In some embodiments, when the bandgap reference circuit 100 is rebooted, the preset trim code TCP stored in the memory block 21 is retrieved in order to set the resistor R4 in the bandgap reference circuit 100 to the preset resistance, so as to set the reference signal VGB to an appropriate voltage level. As should be noted, in the above-described structure of the memory block 21, the voltage applied to the gate terminal G211 is generated by using the reference signal VGB as the reference point. The preset trim code TCP stored in the memory block 21 can be correctly read out without damaging the memory cells 210 only if the gate terminal G211 is appropriately biased. For example, when a voltage level at the gate terminal G211 is too low, there is no current flowing along the arrow shown in FIG. 2B even if the gate oxide layer of the programmable transistor 211 is ruptured, so that the erroneous data of logic "1" is read out instead of reading out the data of logic "0". In this case, an erroneous code different from the preset trim code TCP is read out. Also, when the voltage level at the gate terminal G211 is too high, although the preset trim code TCP can be read out, it may cause damage to the memory cells 210 and speed up the aging of the memory cells 210. However, until the preset trim code TCP is retrieved from the memory circuit 20, the gate terminal G211 cannot be appropriately biased because the appropriate voltage level of the reference signal VGB, indicated by the preset trim code TCP, remains unknown.

Figure 3:
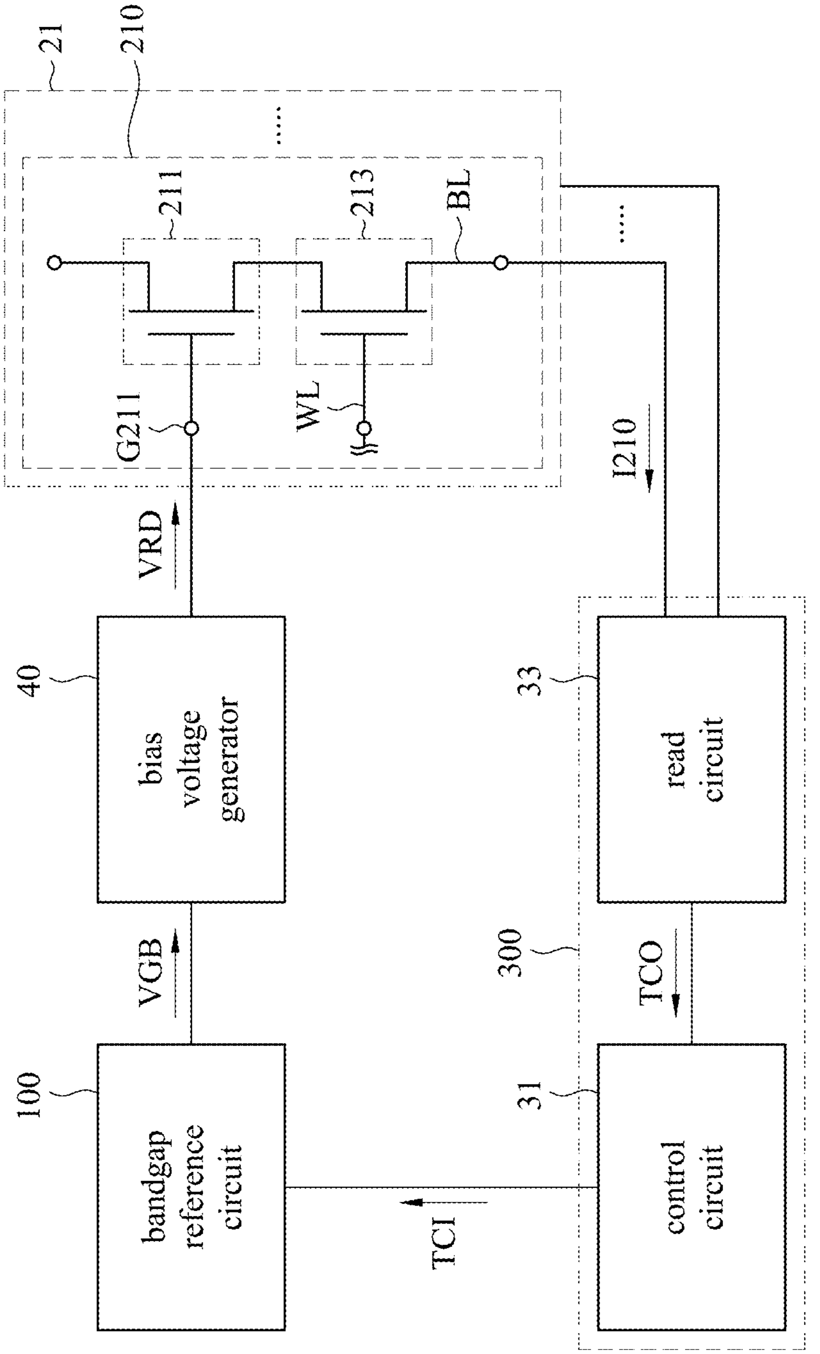
FIG. 3 is a schematic diagram of a trim code reloading system in accordance with some embodiments of the present disclosure.

In view of those issues, the present disclosure proposes a trim code reloading system 300. The trim code reloading system 300 is used to retrieve the preset trim code TCP stored in the memory block 21 of the memory circuit 20 in FIG. 2A. Referring to FIG. 3, FIG. 3 is a schematic diagram of the trim code reloading system 300 in accordance with some embodiments of the present disclosure. In some embodiments, the trim code reloading system 300 includes a control circuit 31 and a read circuit 33. The control circuit 31 is coupled to the bandgap reference circuit 100 and the read circuit 33, and the read circuit 33 is coupled to the memory block 21 through bit lines BL.

Figure 4:
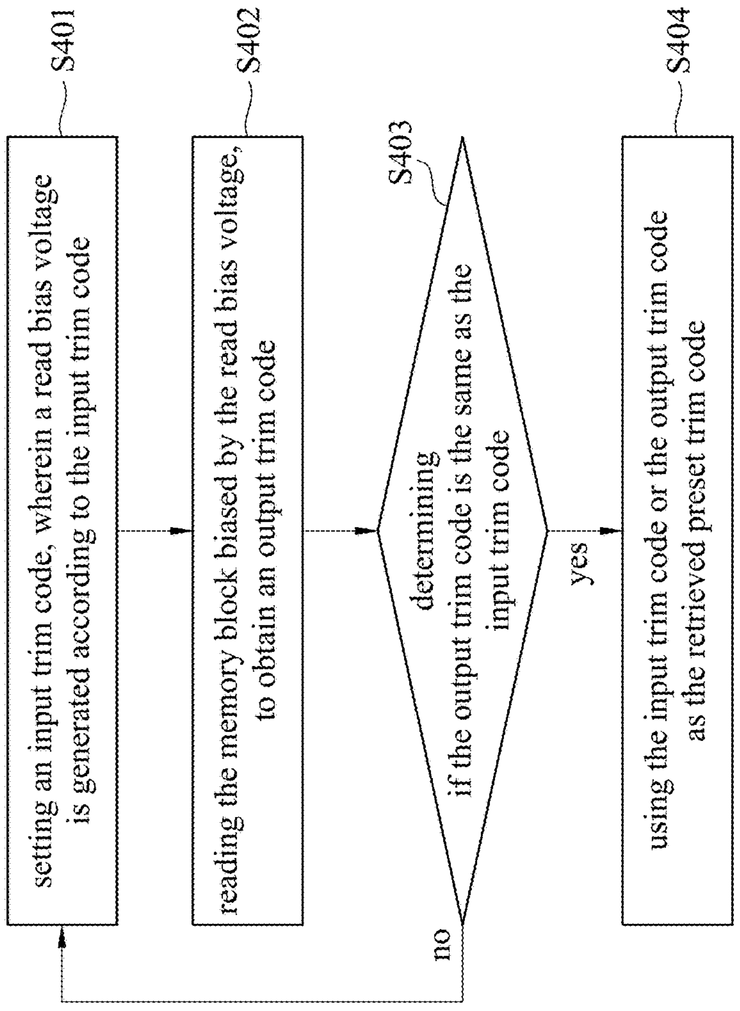
FIG. 4 is a flow diagram of a method for retrieving preset trim code in accordance with some embodiments of the present disclosure.

The operations of the trim code reloading system 300 would be described with reference to a method 400 for retrieving the preset trim code TCP. Referring to FIG. 4, FIG. 4 is a flow diagram of the method 400 for retrieving the preset trim code TCP in accordance with some embodiments of the present disclosure. In some embodiments, as shown in FIG. 4, the method 400 includes operations S401-S404, but the present disclosure is not limited herein.

Figure 5A:
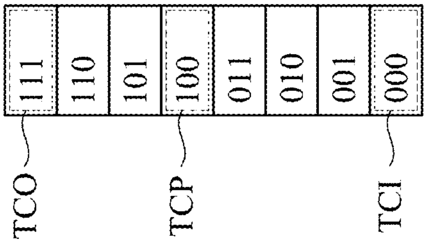
FIGS. 5A-5C are schematic diagrams of processes of retrieving a preset trim code in accordance with some embodiments of the present disclosure.
Figure 5B:
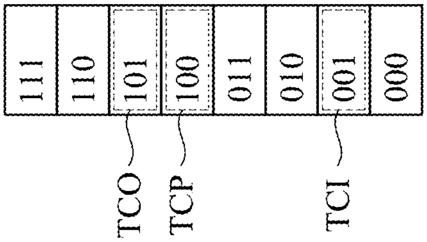
Figure 5C:
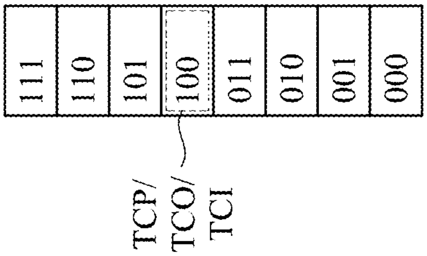

The method 400 would be described in detail below with reference to FIGS. 5A-5C. FIGS. 5A-5C are schematic diagrams for illustrating processes of retrieving the preset trim code TCP, in accordance with some embodiments of the present disclosure. It should be understood that the memory block 21 may include at least three programmable transistors 211 (or at least three memory cells 210) in some embodiments, in order to store the preset trim code TCP having the bit length of 3. Furthermore, as shown in FIGS. 5A-5C, the preset trim code TCP is a binary code of "100", which means, among the three programmable transistors 211, the gate oxide layers of two programmable transistors 211 are ruptured.

In operation S401, the control circuit 31 of the trim code reloading system 300 sets an input trim code TCI, in which a read bias voltage VRD is generated according to the input trim code TCI. In some embodiments, as shown in FIG. 5A, when operation S401 is executed for the first time after the bandgap reference circuit 100 is rebooted, the input trim code TCI set by the control circuit 31 is a binary code of "000". In accordance with the descriptions of the bandgap reference circuit 100 in FIG. 1, the resistor R4 is the variable resistor. In some embodiments, the input trim code TCI is transmitted to a controller (e.g., the controller 10 of FIG. 2A), and this controller sets the resistor R4 in the bandgap reference circuit 100 to have a first resistance indicated by the input trim code TCI of "000. Consequently, the bandgap reference circuit 100 generates the reference signal VGB, which is at a first voltage level corresponding to the input trim code TCI of "000", according to the equation (2). In addition, as shown in FIG. 3, a bias voltage generator 40 is coupled between the bandgap reference circuit 100 and the memory block 21, and is configured to use the reference signal VGB at the first voltage level as a reference point to generate the read bias voltage VRD.

As shown in FIG. 3, the read bias voltage VRD is used to bias the memory block 21. In particular, the read bias voltage VRD is provided to the gate terminal(s) G211 of the selected programmable transistor(s) 211 in the memory block 21. The selected memory cell 210 may generate an output current 1210 according to the read bias voltage VRD and a state (e.g., a ruptured state, a non-ruptured state, etc.) of the gate oxide layer of the programmable transistor 211 in the selected memory cell 210.

In operation S402, the read circuit 33 of the trim code reloading system 300 reads the memory block 21 biased by the read bias voltage VRD, to obtain an output trim code TCO. As should be understood, if the read circuit 33 receives the output current 1210 of the selected memory cell 210, the read circuit 33 equivalently reads out the data of logic "0" of the selected memory cell 210. In contrast, if the read circuit 33 does not receive the output current 1210 or receives approximately no current from the selected memory cell 210, the read circuit 33 equivalently reads out the data of logic "1" of the selected memory cell 210.

In some embodiments of operation S402, because a voltage level of the read bias voltage VRD generated according to the input trim code TCI of "000" is too low, the two memory cells 210 having the ruptured programmable transistors 211 in the memory block 21 generate approximately zero output current 1210. Also, because the gate oxide layer of the other programmable transistor 211 in the memory block 21 is not ruptured, the memory cell 210 having this unruptured programmable transistor 211 generates no output current 1210. Accordingly, as shown in FIG. 5A, the output trim code TCO read out by the read circuit 33 is a binary code of "111" but not the preset trim code TCP of "100" stored in the memory block 21.

In operation S403, the control circuit 31 of the trim code reloading system 300 determines if the output trim code TCO is the same as the input trim code TCI. In the embodiments of FIG. 5A, the control circuit 31 determines that the output trim code TCO of "111" is not the same as the input trim code TCI of "000". In such conditions, as shown in FIG. 4, the control circuit 31 sets another input trim code TCI (i.e., operation S401 is executed again). For example, as shown in FIG. 5B, the input trim code TCI is increased by binary one (1), changing the input trim code TCI from "000" to "001". That is to say, the control circuit 31 sets another input trim code TCI when (or in response to) the output trim code TCO is not the same as the input trim code TCI.

By the input trim code TCI of "001", the resistance "r3" of the resistor R4 in the bandgap reference circuit 100 is increased from the first resistance to a second resistance. According to the equation (2), the voltage level of the reference signal VGB generated by the bandgap reference circuit 100 is increased from the first voltage level to a second voltage level. In other words, the second voltage level corresponding to the input trim code TCI of "001" is greater than the first voltage level corresponding to the input trim code TCI of "000". Also, the bias voltage generator 40 uses the reference signal VGB at the second voltage level to generate the read bias voltage VRD with an increased voltage level.

In the embodiments of FIG. 5B, the increased voltage level of the read bias voltage VRD generated according to the input trim code TCI of "001" induces only one of the two ruptured memory cells 210, which have the ruptured programmable transistors 211, to generate the output current 1210, while the other two memory cells 210 remain unconducted. This result is because of the slight characteristic difference among the three memory cells 210. Accordingly, in some embodiments of operation S402, the output trim code TCO read out by the read circuit 33 is a binary code of "101". Then, in some embodiments of operation S403, the control circuit 31 determines that the output trim code TCO of "101" is not the same as the input trim code TCI of "001". In such conditions, as shown in FIG. 4, operations S401-S403 are executed again. Comparing with the previous round of operations S401-S403, the output trim code TCO becomes closer to the preset trim code TCP, but still not the preset trim code TCP stored in the memory block 21.

As can be seen from the descriptions of operations S401-S403, the input trim code TCI is set (i.e., updated) by the control circuit 31 when the output trim code TCO is not the same as the input trim code TCI. In some embodiments, in the fifth round of operations S401-S403 as shown in FIG. 5C, the input trim code TCI set by the control circuit 31 is a binary code of "100". By the input trim code TCI of "100", the resistance "r3" of the resistor R4 in the bandgap reference circuit 100 becomes the preset resistance, such that the read bias voltage VRD generated according to the input trim code TCI of "100" biases the memory block 21 appropriately. That is to say, the two ruptured memory cells 210, which have the two programmable transistors 211 with the ruptured gate oxide layers, generate the output currents 1210. Accordingly, the output trim code TCO read out by the read circuit 33 in operation S402 is a binary code of "100" the same as the preset trim code TCP of "100" stored in the memory block 21. Then, in operation S403, the control circuit 31 determines that the output trim code TCO of "100" is the same as the input trim code TCI of "100".

Based on the above descriptions, as shown in FIG. 4, operation S404 is executed. In operation S404, the control circuit 31 of the trim code reloading system 300 uses the input trim code TCI or the output trim code TCO as the retrieved preset trim code TCP, and the method 400 may be finished. That is to say, the control circuit 31 uses the input trim code TCI or the output trim code TCO as the retrieved preset trim code TCP when (or in response to) the output trim code TCO is the same as the input trim code TCI. When the method 400 is finished, the preset trim code TCP retrieved from the memory circuit 20 may be transmitted to the controller (e.g., the controller 10 of FIG. 2A). The resistor R4 may be kept, by the controller, at the resistance indicated by the preset trim code TCP retrieved from the memory circuit 20.

In some further embodiments of operation S401, the control circuit 31 increases the input trim code TCI in FIG. 5A by a preset value to become the input trim code TCI as shown in FIG. 5B. This preset value is the binary one, but is not limited herein. Thus, the input trim code TCI in FIG. 5B is greater than the input trim code TCI in FIG. 5A.

As can be seen from the descriptions of the method 400, the trim code reloading system 300 sets the input trim code TCI from the minimal binary code (e.g., "000" in FIG. 5A), and increases the input trim code TCI when the output trim code TCO is not the same as the input trim code TCI, such that the input trim code TCI approximates to the preset trim code TCP gradually. In some cases, despite the input trim code TCI being lower than the preset trim code TCP, the memory block 21 may unexpectedly operate correctly due to operating conditions of the memory block 21 such as environmental temperature, resulting the output trim code TCO matching the preset trim code TCP sooner than anticipated. The trim code reloading system 300 can keep conducting operations S401-S403 until determining that the output trim code TCO is identical to the input trim code TCI. The trim code reloading system 300 can easily obtain the preset trim code TCP stored in the memory block 21 by finding the input trim code TCI which is the same as the output trim code TCO. Furthermore, during the operation of the trim code reloading system 300, because the input trim code TCI is increased gradually from the minimal binary code, making the read bias voltage VRD increase gradually from the minimal voltage level, the memory cells 210 are not damaged due to being biased by an excessively high voltage.

It should be understood that the trim code reloading system 300 and the method 400 are not limited to the descriptions in the above embodiments. For example, in some embodiments, the preset trim code TCP is stored in the memory circuit 20 including multiple memory blocks 21 whose number is an odd number. In these embodiments, even if few of the memory blocks 21 are aged, causing the preset trim code TCP stored therein to become corrupted, the control circuit 31 can still retrieve the correct preset trim code TCP, by applying the majority rule in the examination to the readout results of all memory blocks 21 generated by the read circuit 33. These embodiments would be described in detail below with reference to FIGS. 6A and 6B.

Figure 6A:
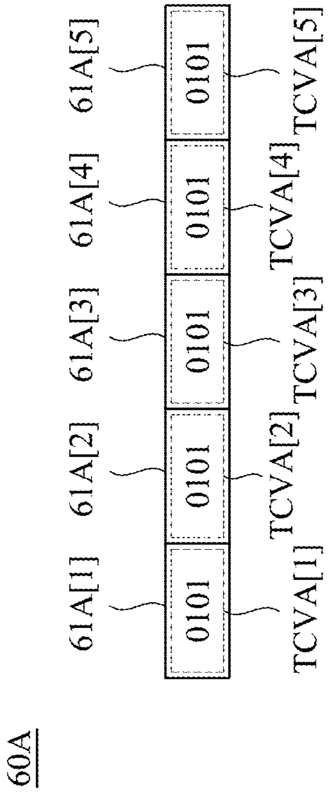
FIGS. 6A-6B are schematic diagrams of a memory circuit including multiple memory blocks in accordance with some embodiments of the present disclosure.

Referring to FIG. 6A, FIG. 6A is a schematic diagram of a memory circuit 60A including five memory blocks 61A[1]-61A[5] in accordance with some embodiments of the present disclosure. The trim code reloading system 300 may perform operations S401-S403 to each of the memory blocks 61A[1]-61A[5] individually. In this embodiment, the control circuit 31 sets multiple input trim codes TCI for the memory blocks 61A[1]-61A[5], respectively, according to operation S401, and the read circuit 33 reads the memory blocks 61A[1]-61A[5] to obtain multiple output trim codes TCO according to operation S402. When the control circuit 31, according to operation S403, determines that the input trim codes TCI set for the memory blocks 61A[1]-61A[5]

are respectively identical to the output trim codes TCO obtained by the read circuit 33 reading the memory blocks 61A[1]-61A[5], instead of executing operation S404, the control circuit 31 sets the input trim codes TCI (or the output trim codes TCO) as a plurality of candidate preset trim codes TCVA[1]-TCVA[5], that is, the control circuit 31 obtains the candidate preset trim codes TCVA[1]-TCVA[5]. It should be understood that the candidate preset trim codes TCVA[1]-TCVA[5] may be obtained asynchronously. The control circuit 31 classifies the candidate preset trim codes TCVA [1]-TCVA[5] into different groups, based on binary values thereof, where all candidate preset trim codes in a group are identical, such as having the same binary value. For each group, the control circuit 31 counts a number of candidate preset trim codes in such group. For example, in FIG. 6A, there is a first group composed of five (5) candidate preset trim codes having the binary value of "0101" and no other group of candidate preset trim code having other value. Then, the control circuit 31 determines if there is a group having the number of candidate preset trim codes greater than a majority threshold. If so, the control circuit 31 uses a candidate preset trim code in such group as the preset trim code TCP. In particular, the majority threshold is greater than a number of the plurality of memory blocks being minus 1 first and multiplied by 0.5 then, and is smaller than the number of the plurality of memory blocks. For example, the majority threshold may be a positive integer selected from a range of 2-4 in the embodiments of FIG. 6A. Taking FIG. 6A as an example, the number (i.e., 5) of the candidate preset trim codes "0101" in the first group is greater than the majority threshold (e.g., 2), and thus the control circuit 31 uses a candidate preset trim code "0101" in the first group as the retrieved preset trim code TCP. The preset trim code TCP retrieved from the memory circuit 60A may be transmitted to the controller (e.g., the controller 10 of FIG. 2A). The resistor R4 may be kept, by the controller, at the resistance indicated by the preset trim code TCP retrieved from the memory circuit 60A.

Figure 6B:
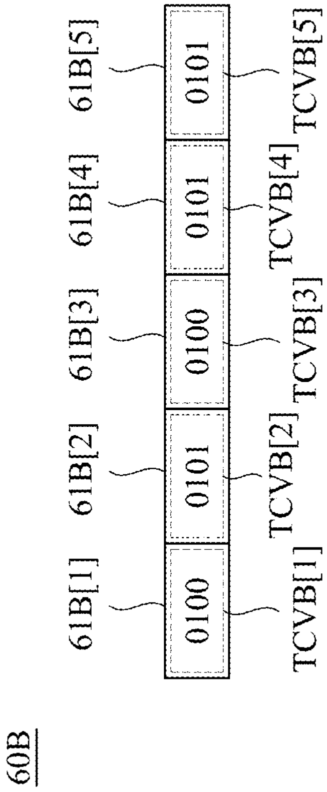

Referring to FIG. 6B, FIG. 6B is a schematic diagram of a memory circuit 60B including five memory blocks 61B [1]-61B[5] in accordance with some embodiments of the present disclosure. The trim code reloading system 300 may perform to the memory circuit 60B operations similar to those described with FIG. 6A, and therefore only differences between the embodiments of FIGS. 6A-6B are described. In the embodiments of FIG. 6B, when multiple input trim codes TCI set for the memory blocks 61B[1]-61B[5] are respectively the same as multiple output trim codes TCO obtained by the read circuit 33 reading the memory blocks 61B[1]-61B[5], the control circuit 31 obtains a plurality of candidate preset trim codes TCVB[1]-TCVB[5]. The control circuit 31 classifies the candidate preset trim codes TCVB [1]-TCVB[5] into a first group corresponding to the binary value of "0100" and a second group corresponding to the binary value of "0101". Then, the control circuit 31 determines if a number of candidate preset trim codes of each of the first group and the second group is greater than the majority threshold. The majority threshold is also 2 in the embodiments of FIG. 6B. In FIG. 6B, the number (i.e., 2) of the candidate preset trim codes in the first group corresponding to the binary value of "0100" is not greater than the majority threshold, and the number (i.e., 3) of the candidate preset trim codes in the second group corresponding to the binary value of "0101" is greater than the number threshold. Thus, the control circuit 31 uses a candidate preset trim code of "0101" of the second group as the retrieved preset trim code TCP. As should be noted, this result means that the memory blocks 61B[1] and 61B[3] where the read circuit 33 reads out the candidate preset trim code of "0100" may have been damaged due to aging.

As can be seen from the descriptions of the embodiments of FIGS. 6A and 6B, by verifying the readout result based on the majority rule, the control circuit 31 can retrieve the correct preset trim code TCP from the memory blocks which are not damaged due to aging, such that the trim code reloading system 300 and the method 400 for retrieving the preset trim code TCP have advantages of high reliability.

The disclosed methods, may take the form of a program code (i.e., executable instructions) embodied in tangible media, such as floppy diskettes, CD-ROMS, hard drives, or any other machine-readable storage medium, wherein, when the program code is loaded into and executed by a machine, such as a computer, the machine thereby becomes an apparatus for practicing the methods. The methods may also be embodied in the form of a program code transmitted over some transmission medium, such as electrical wiring or cabling, through fiber optics, or via any other form of transmission, wherein, when the program code is received and loaded into and executed by a machine, such as a computer, the machine becomes an apparatus for practicing the disclosed methods. When implemented on a general-purpose processor, the program code combines with the at least one processor to provide a unique apparatus that operates analogously to application specific logic circuits.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A method for retrieving a preset trim code, wherein the preset trim code is for trimming a bandgap reference circuit and is stored in a memory block, and the method comprises:

setting a first input trim code for the bandgap reference circuit, wherein a read bias voltage is generated according to the first input trim code;

reading the memory block biased by the read bias voltage, to obtain an output trim code;

determining if the output trim code is the same as the first input trim code; and using the first input trim code or the output trim code as a retrieved preset trim code when the output trim code is the same as the first input trim code.

2. The method of claim 1, further comprising:

setting a second input trim code, which is greater than the first input trim code, for the bandgap reference circuit when the output trim code is not the same as the first input trim code.

3. The method of claim 2, wherein setting the second input trim code for the bandgap reference circuit comprises:

increasing the first input trim code by a preset value to set the second input trim code.

4. The method of claim 3, wherein the first input trim code is a binary code, and the preset value is a binary one.

5. The method of claim 2, wherein the bandgap reference circuit is configured to output a first reference signal and a second reference signal according to the first input trim code and the second input trim code, respectively, and a voltage level of the second reference signal is greater than a voltage level of the first reference signal.

6. A method for retrieving a preset trim code, wherein the preset trim code is for trimming a bandgap reference circuit and is stored in a plurality of memory blocks, and the method comprises:

conducting operations (a)-(c) to each memory block:

(a) setting a first input trim code for the bandgap reference circuit, wherein a read bias voltage is generated according to the first input trim code;

(b) reading the memory block biased by the read bias voltage, to obtain an output trim code; and (c) determining if the output trim code is the same as the first input trim code;

when a plurality of first input trim codes set for the plurality of memory blocks are respectively identical to a plurality of output trim codes obtained by reading the plurality of memory blocks, setting the plurality of first input trim codes or the plurality of output trim codes as a plurality of candidate preset trim codes;

classifying the plurality of candidate preset trim codes into at least one group according to values of the plurality of candidate preset trim codes; and when a first group of the at least one group has a number of candidate preset trim codes greater than a majority threshold, using a candidate preset trim code in the first group as a retrieved preset trim code.

7. The method of claim 6, wherein a number of the plurality of memory blocks is an odd number.

8. The method of claim 6, wherein the majority threshold is greater than a number of the plurality of memory blocks being minus 1 first and multiplied by 0.5 then, and is smaller than the number of the plurality of memory blocks.

9. The method of claim 6, wherein all candidate preset trim codes in the first group are identical.

10. A trim code reloading system, configured to retrieve a preset trim code, wherein the preset trim code is for trimming a bandgap reference circuit and is stored in a memory block, and the trim code reloading system comprises:

a control circuit, coupled to the bandgap reference circuit, and configured to set a first input trim code for the bandgap reference circuit, wherein a read bias voltage is generated according to the first input trim code; and a read circuit, coupled to the control circuit and the memory block, and configured to read the memory block biased by the read bias voltage, to obtain an output trim code, wherein the control circuit is configured to determine if the output trim code is the same as the first input trim code, and is configured to use the first input trim code or the output trim code as a retrieved preset trim code when the output trim code is the same as the first input trim code.

11. The trim code reloading system of claim 10, wherein the control circuit is configured to set a second input trim code, which is greater than the first input trim code, for the bandgap reference circuit when the output trim code is not the same as the first input trim code.

12. The trim code reloading system of claim 11, wherein the control circuit is configured to increase the first input trim code by a preset value to set the second input trim code.

13. The trim code reloading system of claim 12, wherein the first input trim code is a binary code, and the preset value is a binary one.

14. The trim code reloading system of claim 11, wherein the bandgap reference circuit is configured to output a first reference signal and a second reference signal according to the first input trim code and the second input trim code, respectively, and a voltage level of the second reference signal is greater than a voltage level of the first reference signal.

15. The trim code reloading system of claim 10, wherein the bandgap reference circuit comprises an amplifier, a first current mirror transistor, a second current mirror transistor, a third current mirror transistor, a first transistor, a second transistor, a first resistor, a second resistor, a third resistor and a fourth resistor, wherein an output terminal of the amplifier is connected to gate terminals of the first current mirror transistor, the second current mirror transistor and the third current mirror transistor, source terminals of the first current mirror transistor, the second current mirror transistor and the third current mirror transistor are coupled to a power voltage, drain terminals of the first current mirror transistor and the second current mirror transistor are connected to a non-inverting input terminal and an inverting input terminal of the amplifier through a first node and a second node, respectively, and a drain terminal of the third current mirror transistor is connected to a first terminal of the fourth resistor, wherein the first node is connected to first terminals of the first resistor and the second resistor, a gate terminal and a drain terminal of the first transistor are connected to a second terminal of the first resistor, the second node is connected to a gate terminal and a drain terminal of the second transistor and a first terminal of the third resistor, and source terminals of the first transistor and the second transistor and second terminals of the second resistor, the third resistor and the fourth resistor are grounded.

16. The trim code reloading system of claim 15, wherein the first terminal of the fourth resistor is configured to generate a reference signal, and the fourth resistor is a variable resistor having a resistance being set according to the first input trim code.

17. The trim code reloading system of claim 10, wherein the memory block is an one-time programmable (OTP) memory block.

* * * * *